United States Patent
Lu et al.

(10) Patent No.: US 12,342,623 B2
(45) Date of Patent: Jun. 24, 2025

(54) THIN FILM TRANSISTOR

(71) Applicant: AUO Corporation, Hsinchu (TW)

(72) Inventors: Ssu-Hui Lu, Hsinchu (TW);
Chang-Hung Li, Hsinchu (TW);
Kuo-Yu Huang, Hsinchu (TW);
Maw-Song Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 431 days.

(21) Appl. No.: 18/083,588

(22) Filed: Dec. 19, 2022

(65) Prior Publication Data

US 2024/0145482 A1 May 2, 2024

(30) Foreign Application Priority Data

Nov. 1, 2022 (TW) .................................. 111141590

(51) Int. Cl.
| | |
|---|---|
| *H01L 27/12* | (2006.01) |
| *H10D 30/01* | (2025.01) |
| *H10D 30/67* | (2025.01) |
| *H10D 86/01* | (2025.01) |
| *H10D 86/40* | (2025.01) |
| *H10D 86/60* | (2025.01) |

(52) U.S. Cl.
CPC ......... *H10D 86/60* (2025.01); *H10D 30/0321* (2025.01); *H10D 30/6715* (2025.01); *H10D 30/6723* (2025.01); *H10D 30/6734* (2025.01); *H10D 30/6745* (2025.01); *H10D 30/6757* (2025.01); *H10D 86/0221* (2025.01); *H10D 86/0231* (2025.01); *H10D 86/421* (2025.01)

(58) Field of Classification Search
CPC ............... H10D 86/60; H10D 30/0321; H10D 30/6715; H10D 30/6723; H10D 30/6734; H10D 30/6745; H10D 30/6757; H10D 86/0221; H10D 86/0231; H10D 86/421; H10D 30/6733; H10D 30/6713
See application file for complete search history.

(56) References Cited

U.S. PATENT DOCUMENTS

2018/0366498 A1* 12/2018 Deng ................ G02F 1/134309
2019/0051677 A1* 2/2019 Liu ........................ H10D 84/85

FOREIGN PATENT DOCUMENTS

CN         1585137         2/2005

* cited by examiner

*Primary Examiner* — Mohammed R Alam
(74) *Attorney, Agent, or Firm* — JCIPRNET

(57) ABSTRACT

A thin film transistor includes a bottom gate, a semiconductor layer, a top gate, a first auxiliary conductive pattern, a source, and a drain. The semiconductor layer includes a first semiconductor region, a second semiconductor region, a first heavily doped region, a second heavily doped region, a third heavily doped region, a first lightly doped region, a second lightly doped region, and a third lightly doped region. The first heavily doped region and the second heavily doped region are respectively located on two sides of the first semiconductor region. Two ends of the second semiconductor region are directly connected to the third heavily doped region and the third lightly doped region, respectively. The top gate is electrically connected to the bottom gate. The source and the drain are respectively electrically connected to the third heavily doped region and the second heavily doped region of the semiconductor layer.

8 Claims, 9 Drawing Sheets

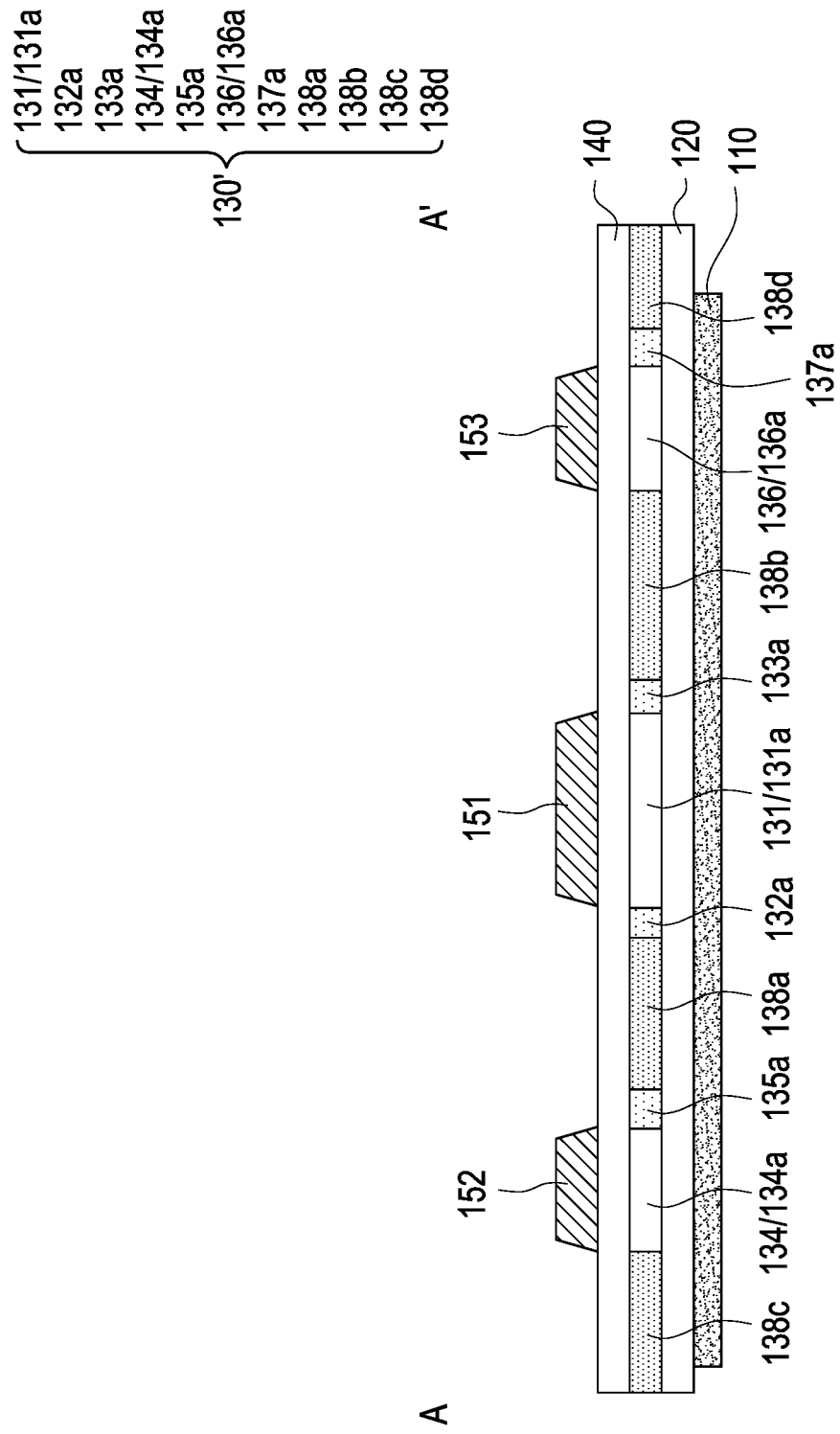

THIN FILM TRANSISTOR

CROSS-REFERENCE TO RELATED APPLICATION

This application claims the priority benefit of Taiwan application serial no. 111141590, filed on Nov. 1, 2022. The entirety of the above-mentioned patent application is hereby incorporated by reference herein and made a part of this specification.

BACKGROUND

Technical Field

The disclosure relates to a thin film transistor.

Related Art

Generally, in flat panel displays, the operation of each pixel is controlled by using thin film transistors, so the quality of thin film transistors will directly affect the quality of the display. As the resolution of flat panel displays continues to increase, the size of thin film transistors should also decrease accordingly. However, when the size of a thin film transistor decreases, it is difficult for the smaller thin film transistor to have ideal electrical properties. Therefore, how to improve the electrical properties of thin film transistors in response to the new design is an issue for developers.

SUMMARY

The disclosure provides a thin film transistor having good electrical properties.

A thin film transistor according to an embodiment of the disclosure includes a bottom gate, a buffer layer, a semiconductor layer, a gate insulating layer, a top gate, a first auxiliary conductive pattern, a source, and a drain. The buffer layer is disposed on the bottom gate. The semiconductor layer is disposed on the buffer layer. The semiconductor layer includes a first semiconductor region, a second semiconductor region, a first heavily doped region, a second heavily doped region, a third heavily doped region, a first lightly doped region, a second lightly doped region, and a third lightly doped region. The first heavily doped region is located between the first semiconductor region and the second semiconductor region. The first heavily doped region and the second heavily doped region are respectively located on two sides of the first semiconductor region. The first heavily doped region and the third heavily doped region are respectively located on two sides of the second semiconductor region. The first lightly doped region is located between the first heavily doped region and the first semiconductor region. The second lightly doped region is located between the first semiconductor region and the second heavily doped region. The third lightly doped region is located between the second semiconductor region and the first heavily doped region. Two ends of the second semiconductor region are respectively directly connected to the third heavily doped region and the third lightly doped region. The gate insulating layer is disposed on the semiconductor layer. The top gate and the first auxiliary conductive pattern are disposed on the gate insulating layer and respectively overlap with the first semiconductor region and the second semiconductor region of the semiconductor layer. The top gate is electrically connected to the bottom gate. The source and the drain are respectively electrically connected to the third heavily doped region and the second heavily doped region of the semiconductor layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1A to FIG. 1F are schematic cross-sectional views of a manufacturing process of a thin film transistor according to a first embodiment of the disclosure.

DESCRIPTION OF THE EMBODIMENTS

Figure 1A:
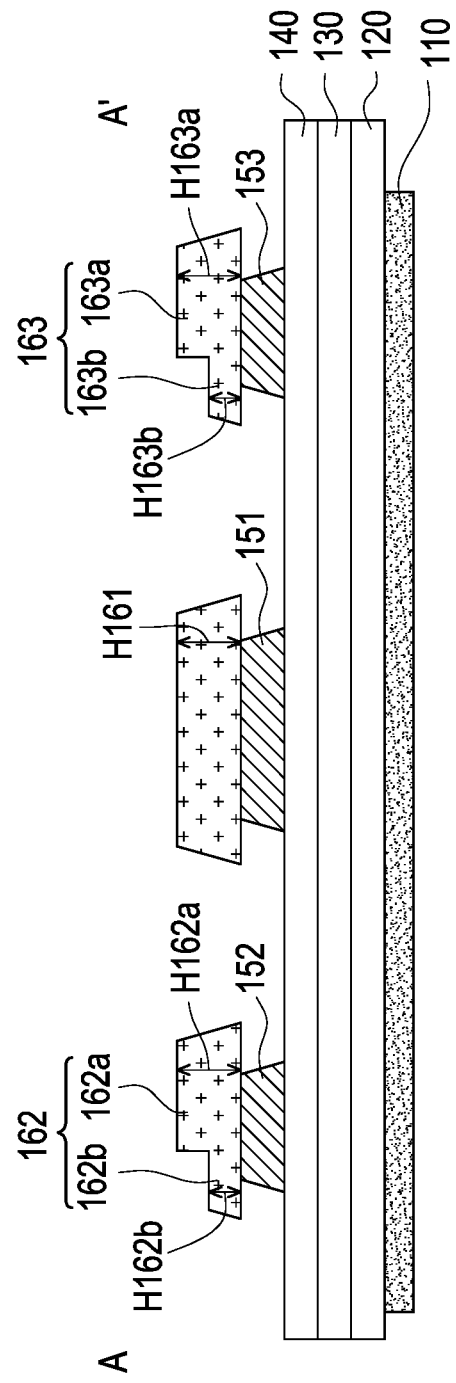

Reference will now be made in detail to the exemplary embodiments of the disclosure, examples of which are illustrated in the accompanying drawings. Wherever possible, the same reference signs will be used in the drawings and description to refer to the same or like parts.

It should be understood that when an element such as a layer, film, region, or substrate is referred to as being "on" or "connected to" another element, it may be directly on or connected to another element, or intermediate elements may also be present. Comparatively, when an element is referred to as being "directly on" or "directly connected to" another element, no intermediate elements are present. As used herein, the term "connection" may refer to physical and/or electrical connection. Furthermore, "electrical connection" or "coupling" may encompass the presence of other elements between two elements.

The term "about", "approximately", or "substantially" as used herein is inclusive of a stated value and a mean within an acceptable range of deviation for a particular value as determined by people having ordinary skill in the art, considering the measurement in question and the particular quantity of errors associated with measurement (i.e., the limitations of the measurement system). For example, "about" may mean within one or more standard deviations or within ±30%, ±20%, ±10%, or ±5% of the stated value. Furthermore, a relatively acceptable range of deviation or standard deviation may be selected for the term "about", "approximately", or "substantially" as used herein based on optical properties, etching properties, or other properties, instead of applying one standard deviation across all properties.

Unless otherwise defined, all terms (including technical and scientific terms) used herein have the same meaning as commonly understood by those skilled in the art to which the disclosure belongs. It should be understood that, these terms, such as those defined in commonly used dictionaries, should be interpreted as having meaning consistent with the relevant technique and the background or context of the disclosure, and should not be interpreted in an idealized or excessively formal way, unless specifically defined in the text of the disclosure.

FIG. 1A to FIG. 1F are schematic cross-sectional views of a manufacturing process of a thin film transistor according to a first embodiment of the disclosure.

Referring to FIG. 1A, first, a bottom gate 110 is formed on a substrate (not shown). In this embodiment, the material of the bottom gate 110 is capable of shielding light. For example, in this embodiment, the material of the bottom gate 110 may be metal. However, the disclosure is not limited thereto, and according to other embodiments, the material of the bottom gate 110 may also be another conductive material such as an alloy, a nitride of a metal material, an oxide of a metal material, an oxynitride of a metal material, or stacked layers of metal materials and other conductive materials.

Referring to FIG. 1A, next, a buffer layer 120 is formed on the substrate (not shown) to cover the bottom gate 110. In this embodiment, the material of the buffer layer 120 may be an inorganic material (e.g., silicon oxide, silicon nitride, silicon oxynitride, or stacked layers of at least two of the above materials), an organic material, or a combination thereof.

Referring to FIG. 1A, next, a semiconductor layer 130 is formed on the buffer layer 120. The semiconductor layer 130 has not been doped yet. For example, in this embodiment, the material of the semiconductor layer 130 may be polysilicon. However, the disclosure is not limited thereto. In other embodiments, the material of the semiconductor layer 130 may also be amorphous silicon, microcrystalline silicon, monocrystalline silicon, an organic semiconductor material, an oxide semiconductor material (e.g., indium zinc oxide, indium gallium zinc oxide, another suitable material, or a combination thereof), another suitable material, or a combination thereof.

Referring to FIG. 1A, next, a gate insulating layer 140 is formed to cover the semiconductor layer 130. In this embodiment, the material of the gate insulating layer 140 may be an inorganic material (e.g., silicon oxide, silicon nitride, silicon oxynitride, or stacked layers of at least two of the above materials), an organic material, or a combination thereof.

Referring to FIG. 1A, next, a top gate 151 and a first auxiliary conductive pattern 152 are formed on the gate insulating layer 140. The top gate 151 and the first auxiliary conductive pattern 152 are disposed on the gate insulating layer 140. In this embodiment, while forming the top gate 151 and the first auxiliary conductive pattern 152, a second auxiliary conductive pattern 153 may also be formed at the same time. The second auxiliary conductive pattern 153 is disposed on the gate insulating layer 140, and the top gate 151, the first auxiliary conductive pattern 152, and the second auxiliary conductive pattern 153 are separated from each other. In this embodiment, the material of the top gate 151, the first auxiliary conductive pattern 152, and the second auxiliary conductive pattern 153 is metal. However, the disclosure is not limited thereto. According to other embodiments, the material of the top gate 151, the first auxiliary conductive pattern 152, and the second auxiliary conductive pattern 153 may also be another conductive material such as an alloy, a nitride of a metal material, an oxide of a metal material, an oxynitride of a metal material, or stacked layers of metal materials and other conductive materials.

Referring to FIG. 1A, next, a first photoresist structure 161 and a second photoresist structure 162 are respectively formed on the top gate 151 and the first auxiliary conductive pattern 152. The first photoresist structure 161 has a substantially uniform thickness H161, and the second photoresist structure 162 includes a first part 162a and a second part 162b having different thicknesses. A thickness H162a of the first part 162a of the second photoresist structure 162 is substantially the same as the thickness H161 of the first photoresist structure 161. A thickness H162b of the second part 162b of the second photoresist structure 162 is smaller than the thickness H162a of the first part 162a of the second photoresist structure 162.

In this embodiment, while forming the first photoresist structure 161 and the second photoresist structure 162, a third photoresist structure 163 may also be formed on the second auxiliary conductive pattern 153 at the same time. The third photoresist structure 163 includes a first part 163a and a second part 163b having different thicknesses. A thickness H163a of the first part 163a of the third photoresist structure 163 is substantially the same as the thickness H161 of the first photoresist structure 161. A thickness H163b of the second part 163b of the third photoresist structure 163 is smaller than the thickness H163a of the first part 163a of the third photoresist structure 163.

Figure 1B:
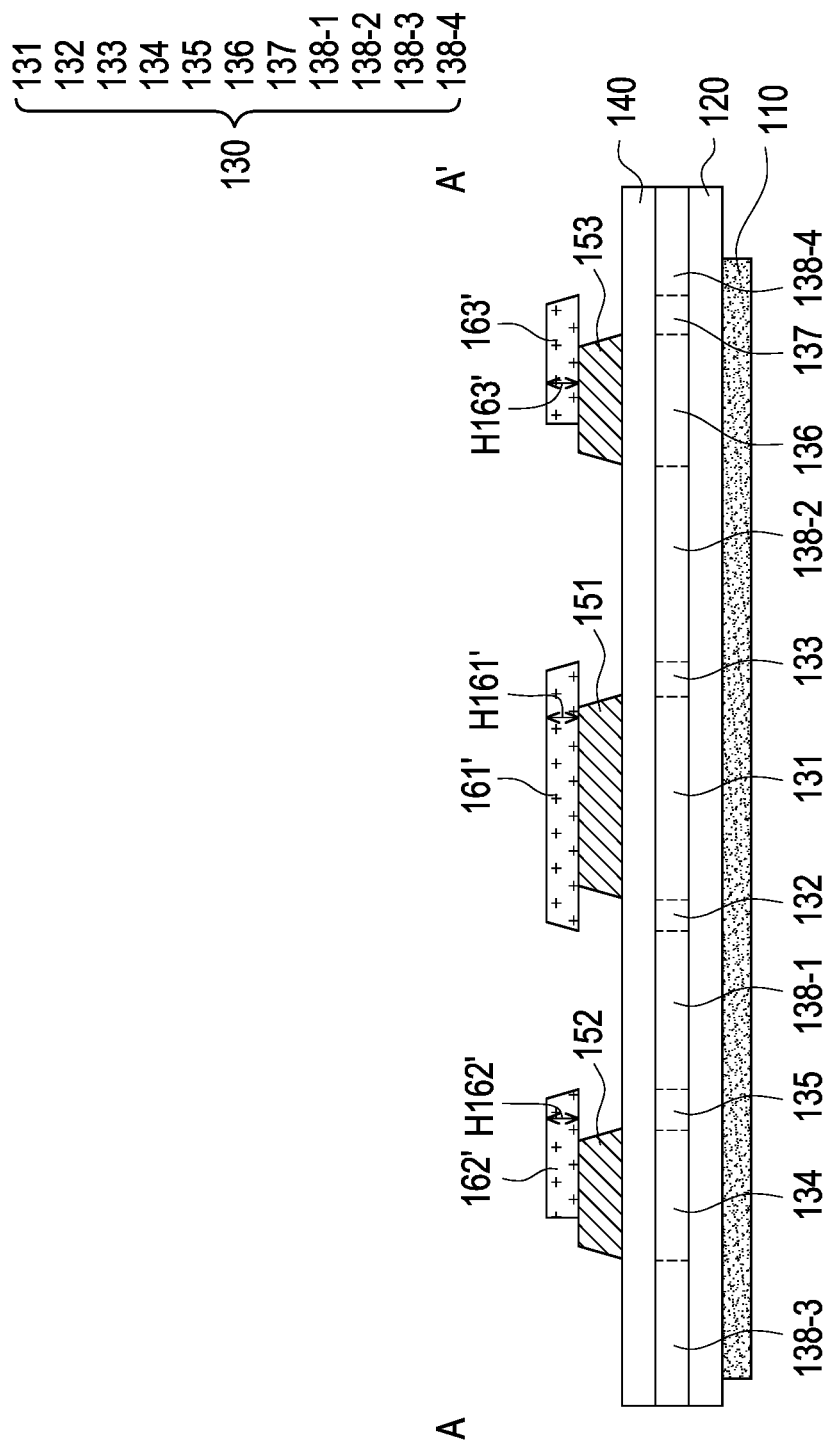

Referring to FIG. 1A and FIG. 1B, next, an ashing process is performed to remove a portion of the first photoresist structure 161, a portion of the second photoresist structure 162, and a portion of the third photoresist structure 163 to respectively form a first photoresist pattern 161', a second photoresist pattern 162', and a third photoresist pattern 163'.

After the ashing process, the thickness H161 of the first photoresist structure 161 is reduced to a thickness H161' to form the first photoresist pattern 161'. The first photoresist pattern 161' has a substantially uniform thickness H161'. The first photoresist pattern 161' extends out of the top gate 151 and shields a plurality of portions 131, 132, and 133 of the semiconductor layer 130 that are respectively located directly below the top gate 151 and on two sides of the top gate 151.

After the ashing process, the second part 162b of the second photoresist structure 162 having the smaller thickness H162b is completely removed, and the thickness H162a of the first part 162a of the second photoresist structure 162 is reduced to a thickness H162' to form the second photoresist pattern 162'. The first auxiliary conductive pattern 152 shields a portion 134 of the semiconductor layer 130 directly below the first auxiliary conductive pattern 152. The second photoresist pattern 162' extends out of the first auxiliary conductive pattern 152. A portion of the second photoresist pattern 162' that extends out of the first auxiliary conductive pattern 152 shields a portion 135 of the semiconductor layer 130 on the right side of the first auxiliary conductive pattern 152.

After the ashing process, the second part 163b of the third photoresist structure 163 having the smaller thickness H163b is completely removed, and the thickness H163a of the first part 163a of the third photoresist structure 163 is reduced to a thickness H163' to form the third photoresist pattern 163'. The second auxiliary conductive pattern 153 shields a portion 136 of the semiconductor layer 130 directly below the second auxiliary conductive pattern 153. The third photoresist pattern 163' extends out of the second auxiliary conductive pattern 153. A portion of the third photoresist pattern 163' that extends out of the second auxiliary conductive pattern 153 shields a portion 137 of the semiconductor layer 130. The first photoresist pattern 161', the second photoresist pattern 162', the third photoresist pattern 163', the top gate 151, the first auxiliary conductive pattern 152, and the second auxiliary conductive pattern 153 do not shield another plurality of portions 138-1, 138-2, 138-3, and 138-4 of the semiconductor layer 130.

Figure 1C:
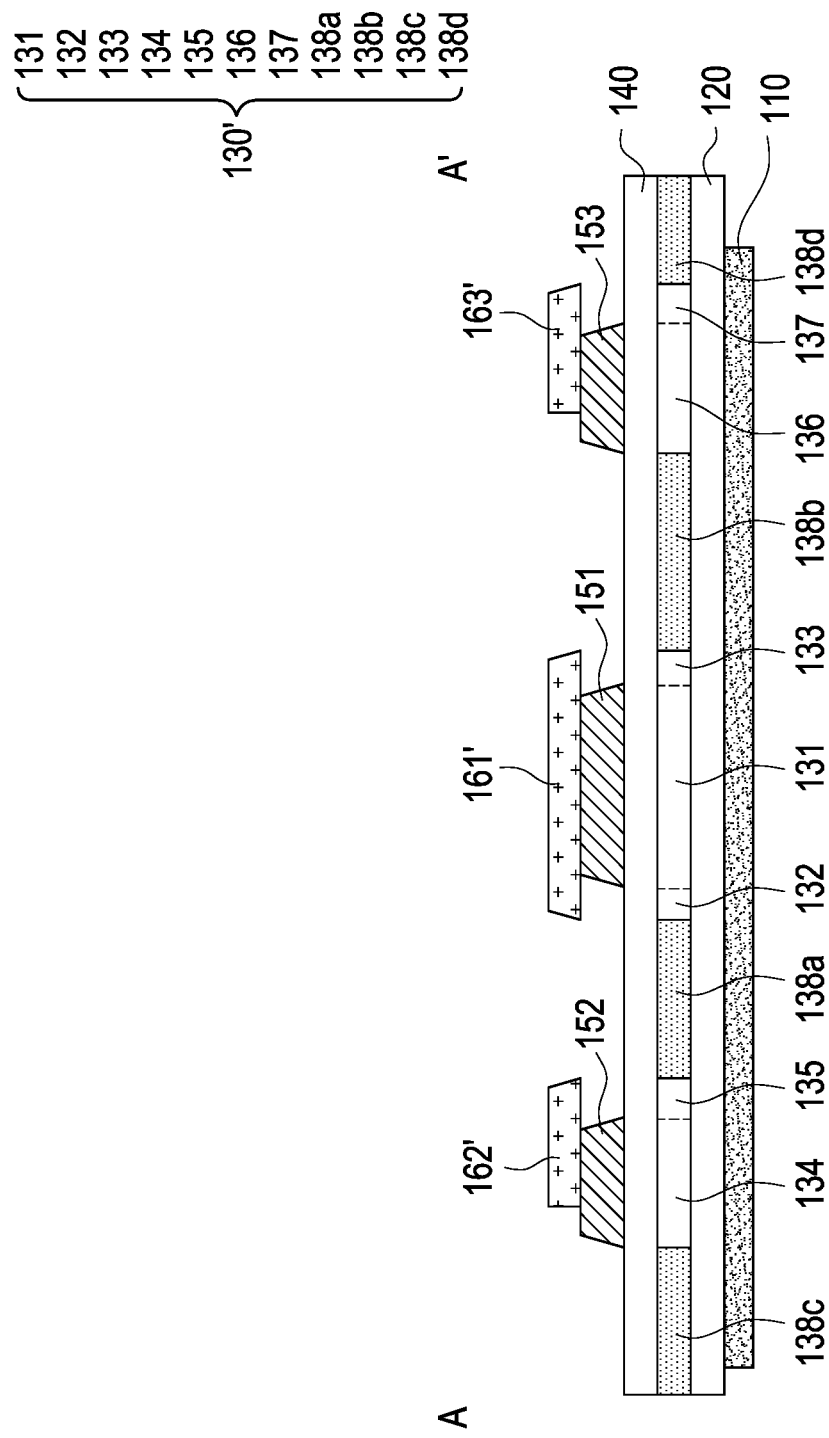

Referring to FIG. 1B and FIG. 1C, next, taking the first photoresist pattern 161', the second photoresist pattern 162', the third photoresist pattern 163', the top gate 151, the first auxiliary conductive pattern 152, and the second auxiliary conductive pattern 153 as masks, a heavy doping process is performed, so that the plurality of portions 138-1, 138-2, 138-3, and 138-4 of the semiconductor layer 130 that are not shielded by the first photoresist pattern 161', the second photoresist pattern 162', the third photoresist pattern 163', the top gate 151, the first auxiliary conductive pattern 152, and the second auxiliary conductive pattern 153 are heavily doped to respectively form a first heavily doped region 138a, a second heavily doped region 138b, a third heavily doped region 138c, and a fourth heavily doped region 138d of the semiconductor layer 130'. On the other hand, the plurality of portions 131, 132, 133, 134, 135, 136, and 137 of the semiconductor layer 130 that are shielded by the first photoresist pattern 161', the second photoresist pattern 162', the third photoresist pattern 163', the top gate 151, the first auxiliary conductive pattern 152, and the second auxiliary conductive pattern 153 retain their original properties.

Figure 1D:
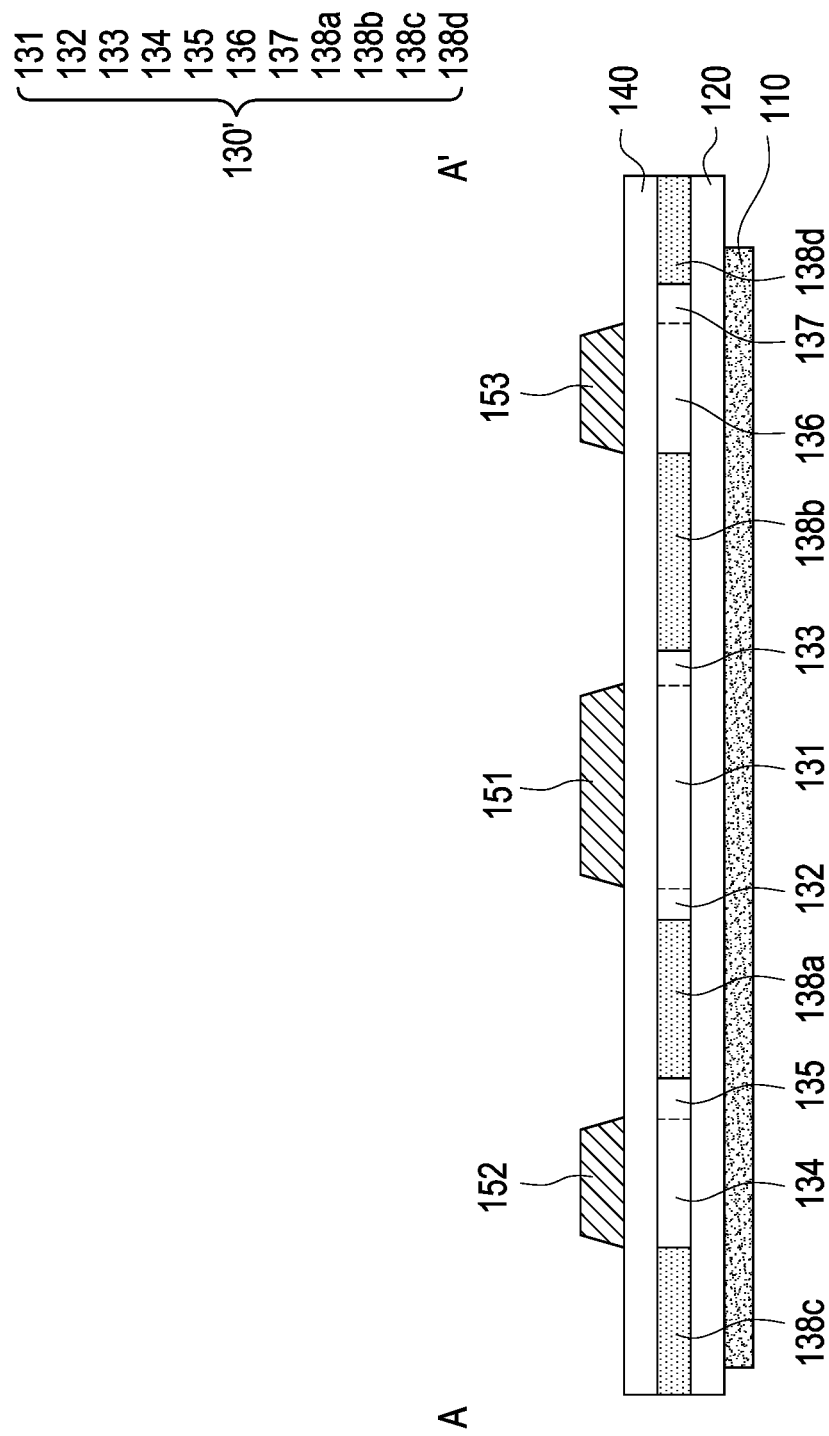

Referring to FIG. 1C and FIG. 1D, next, the first photoresist pattern 161', the second photoresist pattern 162', and the third photoresist pattern 163' are removed. After removing the first photoresist pattern 161', the second photoresist pattern 162', and the third photoresist pattern 163', the plurality of portions 132, 133, 135, and 137 of the semiconductor layer 130 that are originally shielded by the first photoresist pattern 161', the second photoresist pattern 162', and the third photoresist pattern 163' are not shielded by the top gate 151, the first auxiliary conductive pattern 152, and the second auxiliary conductive pattern 153.

Referring to FIG. 1D and FIG. 1E, next, taking the top gate 151, the first auxiliary conductive pattern 152, and the second auxiliary conductive pattern 153 as masks, a light doping process is performed, so that the plurality of portions 132, 133, 135, and 137 of the semiconductor layer 130' that are not shielded by the top gate 151, the first auxiliary conductive pattern 152, and the second auxiliary conductive pattern 153 are lightly doped to respectively form a first lightly doped region 132a, a second lightly doped region 133a, a third lightly doped region 135a, and a fourth lightly doped region 137a of the semiconductor layer 130". After the light doping process is completed, the plurality of portions 131, 134, and 136 of the semiconductor layer 130" are not doped, and the plurality of portions 131, 134, and 136 of the semiconductor layer 130" may be respectively referred to as a first semiconductor region 131a, a second semiconductor region 134a, and a third semiconductor region 136a of the semiconductor layer 130".

Figure 1F:
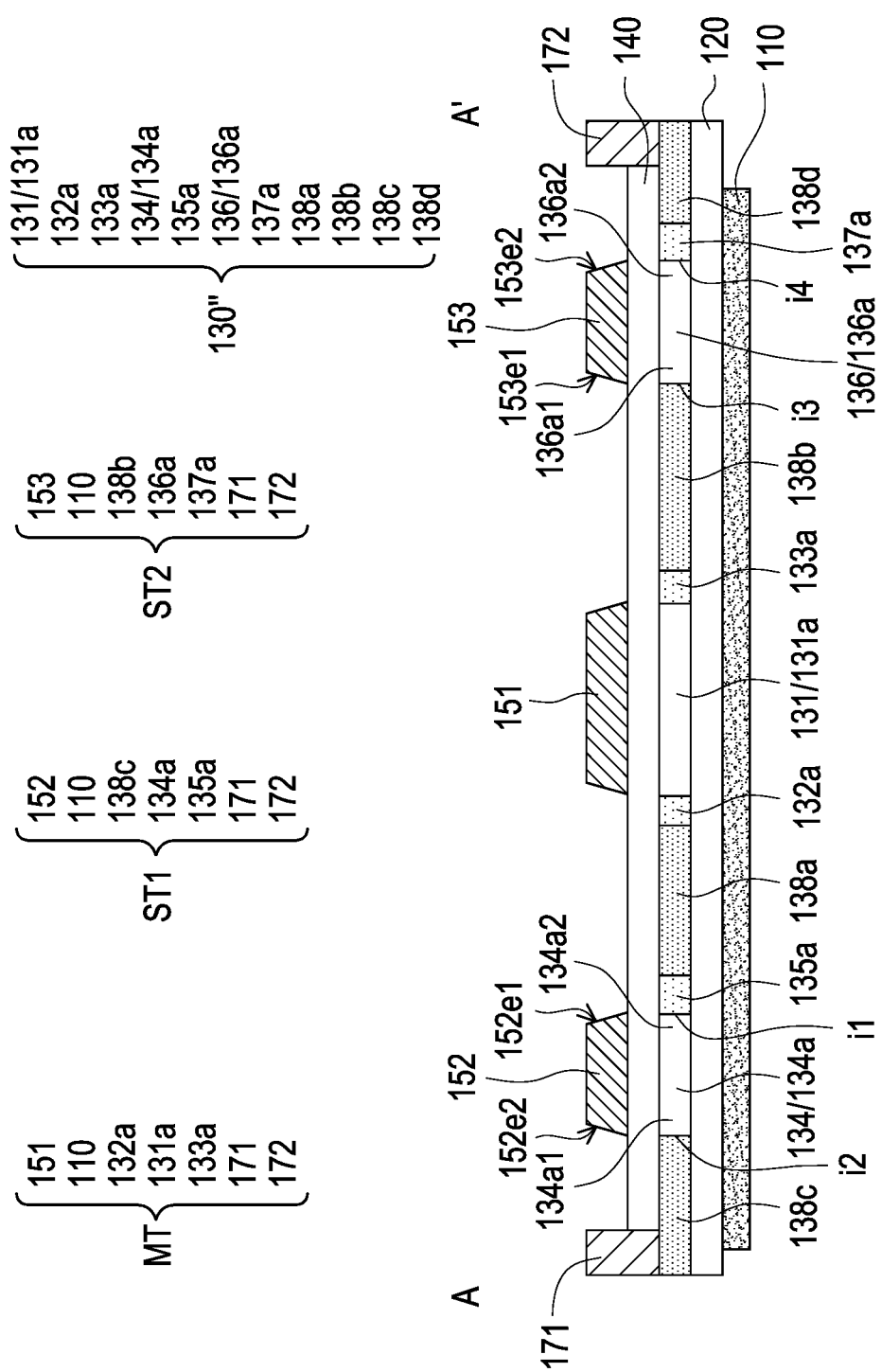

Referring to FIG. 1F, next, a source 171 and a drain 172 are formed, and the source 171 and the drain 172 are respectively electrically connected to the third heavily doped region 138c and the fourth heavily doped region 138d of the semiconductor layer 130. At this time, a thin film transistor 100 of this embodiment is completed.

Figure 2:
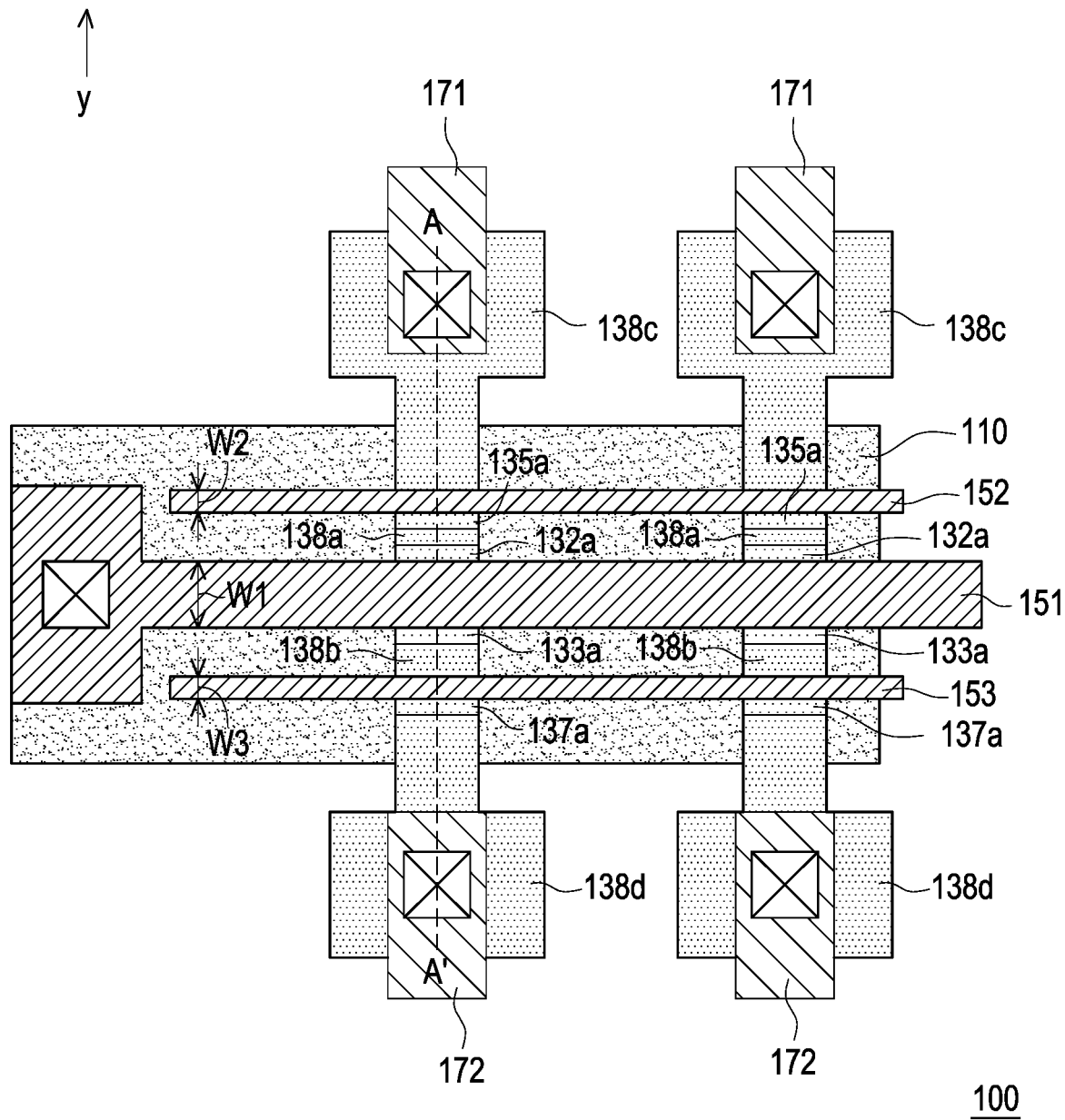
FIG. 2 is a schematic top view of the thin film transistor according to the first embodiment of the disclosure.

FIG. 2 is a schematic top view of the thin film transistor according to the first embodiment of the disclosure. FIG. 1F corresponds to a sectional line A-A' of FIG. 2.

Referring to FIG. 1F and FIG. 2, the thin film transistor 100 includes a bottom gate 110, a buffer layer 120 disposed on the bottom gate 110, a semiconductor layer 130" disposed on the buffer layer 120, a gate insulating layer 140 disposed on the semiconductor layer 130", a top gate 151 and a first auxiliary conductive pattern 152 disposed on the gate insulating layer 140, a source 171, and a drain 172.

The semiconductor layer 130" includes a first semiconductor region 131a, a second semiconductor region 134a, a first heavily doped region 138a, a second heavily doped region 138b, a third heavily doped region 138c, a first lightly doped region 132a, a second lightly doped region 133a, and a third lightly doped region 135a. The top gate 151 and the first auxiliary conductive pattern 152 respectively overlap with the first semiconductor region 131a and the second semiconductor region 134a of the semiconductor layer 130". The top gate 151 is electrically connected to the bottom gate 110. In this embodiment, the first auxiliary conductive pattern 152 is floating.

The first heavily doped region 138a is located between the first semiconductor region 131a and the second semiconductor region 134a. The first heavily doped region 138a and the second heavily doped region 138b are respectively located on two sides of the first semiconductor region 131a, and the first heavily doped region 138a and the third heavily doped region 138c are respectively located on two sides of the second semiconductor region 134a. The first lightly doped region 132a is located between the first heavily doped region 138a and the first semiconductor region 131a. The second lightly doped region 133a is located between the first semiconductor region 131a and the second heavily doped region 138b. The third lightly doped region 135a is located between the second semiconductor region 134a and the first heavily doped region 138a. Two ends 134a1 and 134a2 of the second semiconductor region 134a are respectively directly connected to the third heavily doped region 138c and the third lightly doped region 135a.

In this embodiment, the semiconductor layer 130" may optionally include a third semiconductor region 136a, a fourth lightly doped region 137a, and a fourth heavily doped region 138d. The second heavily doped region 138b is located between the second lightly doped region 133a and the third semiconductor region 136a. The third semiconductor region 136a is located between the second heavily doped region 138b and the fourth lightly doped region 137a. The fourth lightly doped region 137a is located between the third semiconductor region 136a and the fourth heavily doped region 138d. Two ends 136a1 and 136a2 of the third semiconductor region 136a are respectively directly connected to the second heavily doped region 138b and the fourth lightly doped region 137a.

In this embodiment, the thin film transistor 100 may further optionally include a second auxiliary conductive pattern 153 disposed on the gate insulating layer 140 and overlapping with the third semiconductor region 136a of the semiconductor layer 130". In this embodiment, the second auxiliary conductive pattern 153 is floating.

The source 171 and the drain 172 are respectively electrically connected to the third heavily doped region 138c and the fourth heavily doped region 138d of the semiconductor layer 130". In this embodiment, the source 171 is directly electrically connected to the third heavily doped region 138c of the semiconductor layer 130, and the drain 172 is directly electrically connected to the fourth heavily doped region 138d of the semiconductor layer 130. The drain 172 is electrically connected to the second heavily doped region 138b of the semiconductor layer 130" via the fourth heavily doped region 138d, the fourth lightly doped region 137a, and the third semiconductor region 136a of the semiconductor layer 130.

In this embodiment, an interface i1 between the second semiconductor region 134a and the third lightly doped region 135a and an interface i2 between the second semiconductor region 134a and the third heavily doped region 138c are respectively substantially flush with two opposite edges 152e1 and 152e2 of the first auxiliary conductive pattern 152. In this embodiment, an interface i3 between the third semiconductor region 136a and the second heavily doped region 138b and an interface i4 between the third semiconductor region 136a and the fourth lightly doped region 137a are respectively substantially flush with two opposite edges 153e1 and 153e2 of the second auxiliary conductive pattern 153.

Referring to FIG. 2, in this embodiment, the top gate 151 has a first width W1 in a direction y, the first auxiliary conductive pattern 152 has a second width W2 in the direction y, and the second auxiliary conductive pattern 153 has a third width W3 in the direction y. The second width W2 and the third width W3 are smaller than the first width W1. For example, in this embodiment, the first width W1 is greater than or equal to 1.5 µm and smaller than or equal to 6 µm, the second width W2 is greater than or equal to 0.5 µm and smaller than or equal to 1 µm, and the third width W3 is greater than or equal to 0.5 µm and smaller than or equal to 1 µm, but the disclosure is not limited thereto.

Referring to FIG. 1F and FIG. 2, the thin film transistor 100 may include a main transistor MT and a first sub-transistor ST1. The main transistor MT includes the top gate 151, a portion of the bottom gate 110 electrically connected to the top gate 151, the first semiconductor region 131a, the first lightly doped region 132a, the second lightly doped region 133a, the source 171, and the drain 172. The first lightly doped region 132a and the second lightly doped region 133a are substantially symmetrically disposed on two sides of the first semiconductor region 131a. In other words, the lightly doped region of the main transistor MT is designed to be provided symmetrically. The first sub-transistor ST1 includes the first auxiliary conductive pattern 152, the second semiconductor region 134a, the third heavily doped region 138c, the third lightly doped region 135a, the source 171, and the drain 172. One side of the second semiconductor region 134a is provided with the third lightly doped region 135a, and a lightly doped region is not provided between the other side of the second semiconductor region 134a and the third heavily doped region 138c. In other words, the lightly doped region of the first sub-transistor ST1 is designed to be provided asymmetrically.

In this embodiment, the thin film transistor 100 may further include a second sub-transistor ST2. The second sub-transistor ST2 includes the second auxiliary conductive pattern 153, a portion of the bottom gate 110, the third semiconductor region 136a, the second heavily doped region 138b, and the fourth lightly doped region 137a. One side of the third semiconductor region 136a is provided with the fourth lightly doped region 137a, and a lightly doped region is not provided between the other side of the third semiconductor region 136a and the second heavily doped region 138b. In other words, the lightly doped region of the second sub-transistor ST2 is designed to be provided asymmetrically.

The thin film transistor 100 at least includes the main transistor MT and the first sub-transistor ST1. In the main transistor MT, the top gate 151 is electrically connected to the bottom gate 110. The lightly doped region of the main transistor MT is designed to be provided symmetrically, while the lightly doped region of the first sub-transistor ST1 is designed to be provided asymmetrically. Accordingly, the electron mobility and on-current of the thin film transistor 100 can be increased.

The reference signs and part of the contents of the embodiment above apply to the embodiment below. The same or similar components will be labeled with the same reference signs, and descriptions of the same technical contents will be omitted. Reference may be made to the embodiment above for the omitted descriptions, which shall not be repeated in the embodiment below.

Figure 3:
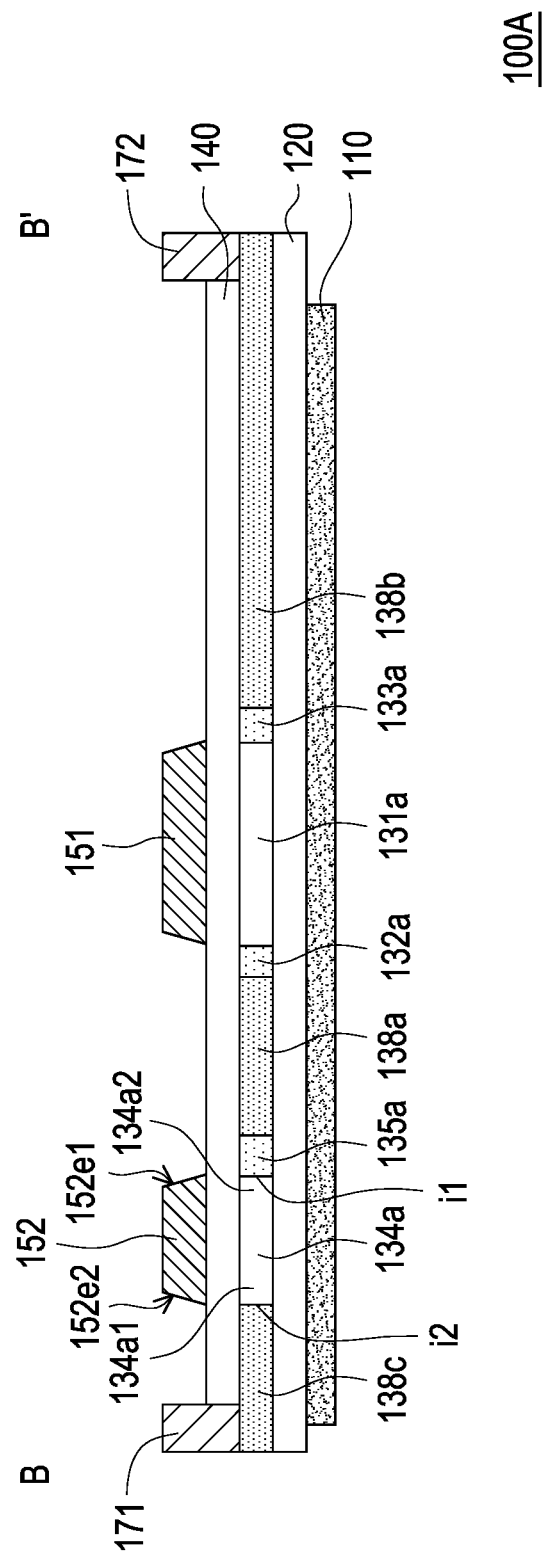
FIG. 3 is a schematic cross-sectional view of a thin film transistor according to a second embodiment of the disclosure.
Figure 4:
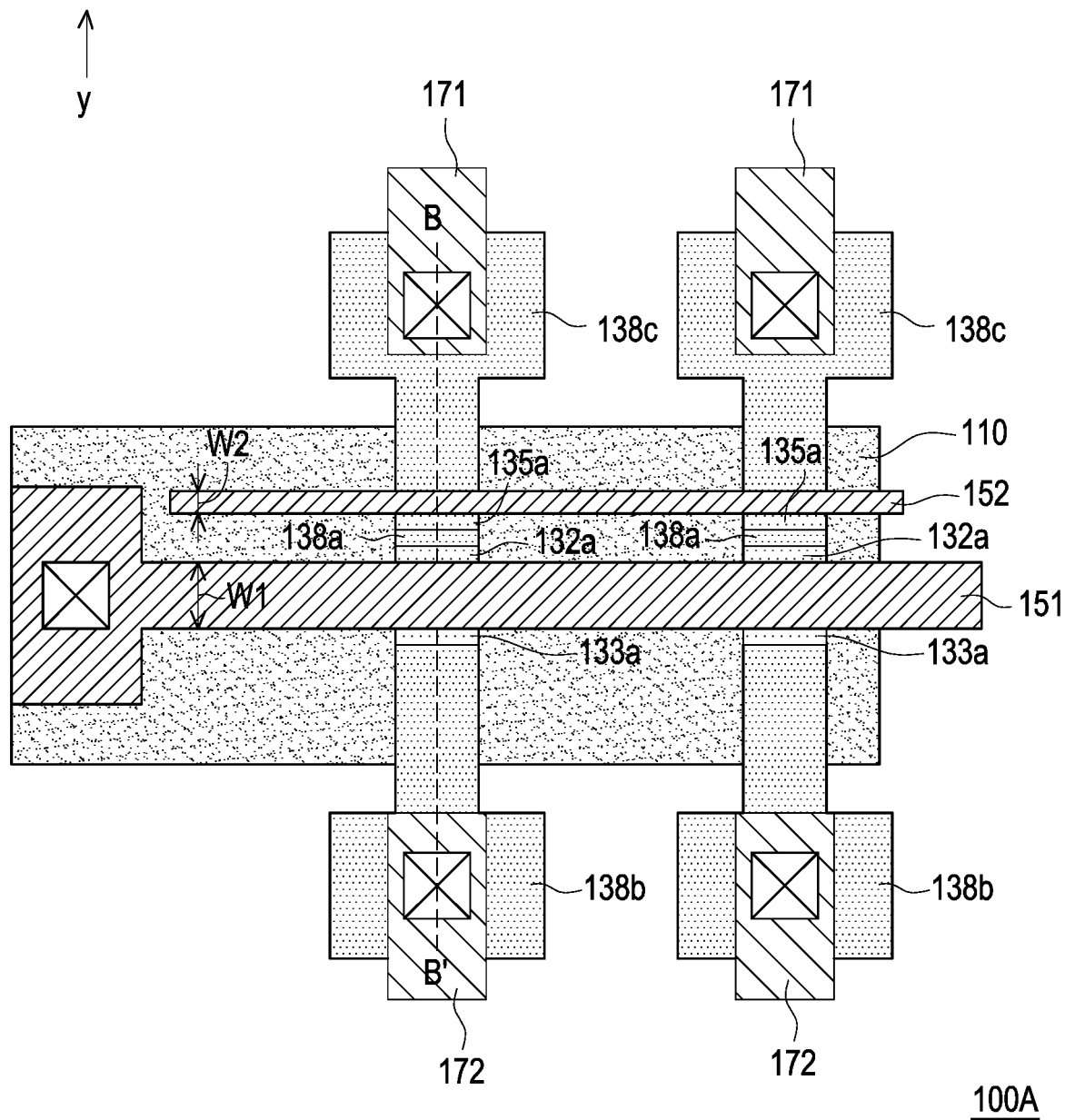
FIG. 4 is a schematic top view of the thin film transistor according to the second embodiment of the disclosure.

FIG. 3 is a schematic cross-sectional view of a thin film transistor according to a second embodiment of the disclosure. FIG. 4 is a schematic top view of the thin film transistor according to the second embodiment of the disclosure. FIG. 3 corresponds to a sectional line B-B' of FIG. 4.

A thin film transistor 100A of FIG. 3 and FIG. 4 is similar to the thin film transistor 100 of FIG. 1F and FIG. 2, and the difference between the two lies in that the second sub-transistor ST2 in FIG. 1F and FIG. 2 is omitted from the thin film transistor 100A in FIG. 3 and FIG. 4.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A thin film transistor comprising:
   a bottom gate;
   a buffer layer disposed on the bottom gate;
   a semiconductor layer disposed on the buffer layer, wherein the semiconductor layer comprises:
      a first semiconductor region and a second semiconductor region;
      a first heavily doped region, a second heavily doped region, and a third heavily doped region, wherein the first heavily doped region is located between the first semiconductor region and the second semiconductor region, the first heavily doped region and the second heavily doped region are respectively located on two sides of the first semiconductor region, and the first heavily doped region and the third heavily doped region are respectively located on two sides of the second semiconductor region; and
      a first lightly doped region, a second lightly doped region, and a third lightly doped region, wherein the first lightly doped region is located between the first heavily doped region and the first semiconductor region, the second lightly doped region is located between the first semiconductor region and the second heavily doped region, the third lightly doped region is located between the second semiconductor region and the first heavily doped region, and two ends of the second semiconductor region are respectively directly connected to the third heavily doped region and the third lightly doped region;
   a gate insulating layer disposed on the semiconductor layer;
   a top gate and a first auxiliary conductive pattern disposed on the gate insulating layer and respectively overlapping with the first semiconductor region and the second semiconductor region of the semiconductor layer, wherein the top gate is electrically connected to the bottom gate; and
   a source and a drain respectively electrically connected to the third heavily doped region and the second heavily doped region of the semiconductor layer.

2. The thin film transistor according to claim 1, wherein an interface between the second semiconductor region and the third lightly doped region and an interface between the second semiconductor region and the third heavily doped region are respectively substantially flush with two opposite edges of the first auxiliary conductive pattern.

3. The thin film transistor according to claim 1, wherein the first auxiliary conductive pattern is floating.

4. The thin film transistor according to claim 1, wherein the top gate has a first width in a direction, the first width is greater than or equal to 1.5 μm and smaller than or equal to 6 μm, the first auxiliary conductive pattern has a second width in the direction, and the second width is greater than or equal to 0.5 μm and smaller than or equal to 1 μm.

5. The thin film transistor according to claim 1, wherein the semiconductor layer further comprises a third semiconductor region, a fourth lightly doped region, and a fourth heavily doped region, the second heavily doped region is located between the second lightly doped region and the third semiconductor region, the third semiconductor region is located between the second heavily doped region and the fourth lightly doped region, the fourth lightly doped region is located between the third semiconductor region and the fourth heavily doped region, the drain is electrically connected to the fourth heavily doped region of the semiconductor layer, and two ends of the third semiconductor region are respectively directly connected to the second heavily doped region and the fourth lightly doped region, and the thin film transistor further comprises a second auxiliary conductive pattern disposed on the gate insulating layer and overlapping with the third semiconductor region of the semiconductor layer.

6. The thin film transistor according to claim 5, wherein an interface between the third semiconductor region and the second heavily doped region and an interface between the third semiconductor region and the fourth lightly doped region are respectively substantially flush with two opposite edges of the second auxiliary conductive pattern.

7. The thin film transistor according to claim 5, wherein the second auxiliary conductive pattern is floating.

8. The thin film transistor according to claim 5, wherein the top gate has a first width in a direction, the first width is greater than or equal to 1.5 μm and smaller than or equal to 6 μm, the second auxiliary conductive pattern has a third width in the direction, and the third width is greater than or equal to 0.5 μm and smaller than or equal to 1 μm.

\* \* \* \* \*